(12) United States Patent
Eto

(10) Patent No.: US 10,818,535 B2
(45) Date of Patent: Oct. 27, 2020

(54) PLASMA PROCESSING-APPARATUS PROCESSING OBJECT SUPPORT PLATFORM, PLASMA PROCESSING APPARATUS, AND PLASMA PROCESSING METHOD

(71) Applicant: Toshiba Memory Corporation, Minato-ku (JP)

(72) Inventor: Hideo Eto, Yokkaichi (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 16/204,160

(22) Filed: Nov. 29, 2018

(65) Prior Publication Data
US 2019/0096731 A1    Mar. 28, 2019

Related U.S. Application Data

(62) Division of application No. 15/258,628, filed on Sep. 7, 2016, now abandoned.

(30) Foreign Application Priority Data

Jul. 8, 2016 (JP) .................................. 2016-136247

(51) Int. Cl.
*H01L 21/683* (2006.01)
*H01J 37/32* (2006.01)
(Continued)

(52) U.S. Cl.
CPC ...... *H01L 21/6833* (2013.01); *H01J 37/3244* (2013.01); *H01J 37/32082* (2013.01);
(Continued)

(58) Field of Classification Search
USPC ................ 118/728–730; 156/345.51–345.55; 361/234
See application file for complete search history.

(56) References Cited

U.S. PATENT DOCUMENTS 6,344,105 B1    2/2002 Daugherty et al.
7,758,764 B2    7/2010 Dhindsa et al.
(Continued)

FOREIGN PATENT DOCUMENTS

JP    2000-294543    10/2000
JP    2003-503841    1/2003
(Continued)

*Primary Examiner* — Rakesh K Dhingra
(74) *Attorney, Agent, or Firm* — Oblon, McClelland, Maier & Neustadt, L.L.P.

(57) ABSTRACT

According to one embodiment, a plasma processing-apparatus processing object support platform includes a lower plate, an upper plate, and a variable condenser. The lower plate is electrically conductive. The upper plate is provided on the lower plate. A processing object is placed on an upper surface of the upper plate. The variable condenser is provided along a circumferential direction of the lower plate in a region at an upper outer circumferential vicinity of the lower plate. The region has an annular configuration. The variable condenser includes a first capacitance element and a second capacitance element disposed respectively on an inner circumferential side and an outer circumferential side in the region having the annular configuration. Mutually-different control voltages are suppliable to the first capacitance element and the second capacitance element.

9 Claims, 10 Drawing Sheets

(51) Int. Cl.
 *H01L 21/3065* (2006.01)
 *H01L 21/67* (2006.01)

(52) U.S. Cl.
 CPC .. *H01J 37/32091* (2013.01); *H01J 37/32174* (2013.01); *H01J 37/32715* (2013.01); *H01L 21/3065* (2013.01); *H01L 21/67069* (2013.01); *H01J 2237/334* (2013.01)

(56) References Cited

U.S. PATENT DOCUMENTS

| | | | | |
|---|---|---|---|---|
| 8,721,833 | B2* | 5/2014 | Chen | H01J 37/32504 |
| | | | | 118/719 |
| 2004/0053428 | A1 | 3/2004 | Steger | |
| 2005/0031796 | A1 | 2/2005 | Wu et al. | |
| 2005/0056622 | A1 | 3/2005 | Steger | |
| 2006/0175016 | A1 | 8/2006 | Edamura et al. | |
| 2008/0236749 | A1* | 10/2008 | Koshimizu | H01J 37/32091 |
| | | | | 156/345.33 |
| 2009/0071938 | A1* | 3/2009 | Dhindsa | H01J 37/32568 |
| | | | | 216/67 |
| 2009/0223810 | A1 | 9/2009 | Dhindsa et al. | |
| 2010/0006225 | A1 | 1/2010 | Yokogawa et al. | |
| 2010/0022293 | A1 | 1/2010 | Lee | |
| 2013/0008609 | A1 | 1/2013 | Koshimizu et al. | |
| 2013/0128397 | A1 | 5/2013 | Sato | |
| 2014/0034243 | A1 | 2/2014 | Dhindsa et al. | |
| 2017/0018411 | A1* | 1/2017 | Sriraman | H01J 37/32568 |

FOREIGN PATENT DOCUMENTS

| | | |
|---|---|---|
| JP | 2005-539397 A | 12/2005 |
| JP | 5097632 | 12/2012 |
| JP | 5199351 | 5/2013 |
| JP | 5554705 | 7/2014 |
| JP | 5564549 | 7/2014 |
| JP | 2015-504609 | 2/2015 |

* cited by examiner

PLASMA PROCESSING-APPARATUS PROCESSING OBJECT SUPPORT PLATFORM, PLASMA PROCESSING APPARATUS, AND PLASMA PROCESSING METHOD

CROSS-REFERENCE TO RELATED APPLICATIONS

This application a divisional of U.S. application Ser. No. 15/258,628, filed on Sep. 7, 2016, which is based upon and claims the benefit of priority from Japanese Patent Application No. 2016-136247, filed on Jul. 8, 2016; the entire contents of which are incorporated herein by reference.

FIELD

Embodiments described herein relate generally to a plasma processing-apparatus processing object support platform, a plasma processing apparatus, and a plasma processing method.

BACKGROUND

For example, a parallel plate-type RIE (Reactive Ion Etching) apparatus is known as a plasma processing apparatus in which a lower electrode that holds a wafer and an upper electrode that is also used as a shower head supplying an etching gas are disposed to be parallel to each other inside a chamber. In the parallel plate-type RIE apparatus, the upper electrode is grounded; high frequency power is supplied to the lower electrode; and the gas that is introduced to the chamber is plasmatized on the wafer surface.

At this time, plasma is formed in the space between the upper electrode and the lower electrode; and the plasma spreads to the outer side of the wafer surface. Therefore, normally, an edge ring is provided on the outer side of the wafer outer circumferential portion of the lower electrode to form the plasma potential to the outer side of the wafer surface in a state that is substantially parallel to the wafer surface. By providing the edge ring on the outer side of the wafer outer circumferential portion, in the etching of the wafer, the ions inside the plasma are incident at an angle that is substantially perpendicular to the wafer surface not only at the central portion of the wafer but also at the circumferential edge portion of the wafer without the electric field being deflected with respect to the perpendicular direction (a direction perpendicular to the wafer surface) even at the circumferential edge portion of the wafer. As a result, the etching can progress without patterning fluctuation over the entire wafer surface.

However, because the ions inside the plasma collide also with the edge ring when the etching of many wafers is repeated in such an RIE apparatus, the edge ring is consumed and the upper surface of the edge ring recedes or deforms. Although the edge ring is provided for adjusting the electric field at the circumferential edge portion of the wafer as described above, if the upper surface of the edge ring undesirably recedes or deforms, the electric field at the circumferential edge portion of the wafer distorts; and the line of electric force at the wafer circumferential edge portion vicinity has an angle that is tilted from perpendicular to the wafer placement surface. Therefore, the patterned configuration due to the etching undesirably is tilted in the direction of the line of electric force at the wafer circumferential edge portion; and there is a risk that the uniformity in the surface of the etched configuration and etching rate may degrade due to the consumption of the edge ring.

BRIEF DESCRIPTION OF THE DRAWINGS

FIGS. 2A and 2B are cross-sectional views, and FIG. 2C is an equivalent circuit diagram;

FIG. 4A is a perspective view, FIG. 4B is an equivalent circuit diagram, and FIG. 4C is another equivalent circuit diagram;

FIG. 5A is a cross-sectional view, and FIG. 5B is a perspective view;

FIG. 6A is a cross-sectional view, and FIG. 6B is a perspective view;

FIG. 8A is a perspective view, and FIG. 8B is an equivalent circuit diagram;

DETAILED DESCRIPTION

According to one embodiment, a plasma processing-apparatus processing object support platform includes a lower plate, an upper plate, and a variable condenser. The lower plate is electrically conductive. The upper plate is provided on the lower plate. A processing object is placed on an upper surface of the upper plate. The variable condenser is provided along a circumferential direction of the lower plate in a region at an upper outer circumferential vicinity of the lower plate. The region has an annular configuration. The variable condenser includes a first capacitance element and a second capacitance element disposed respectively on an inner circumferential side and an outer circumferential side in the region having the annular configuration. Mutually-different control voltages are suppliable to the first capacitance element and the second capacitance element.

A plasma processing-apparatus processing object support platform, a plasma processing apparatus, and a plasma processing method according to embodiments will now be described in detail with reference to the accompanying drawings. The invention is not limited to these embodiments.

Figure 1:
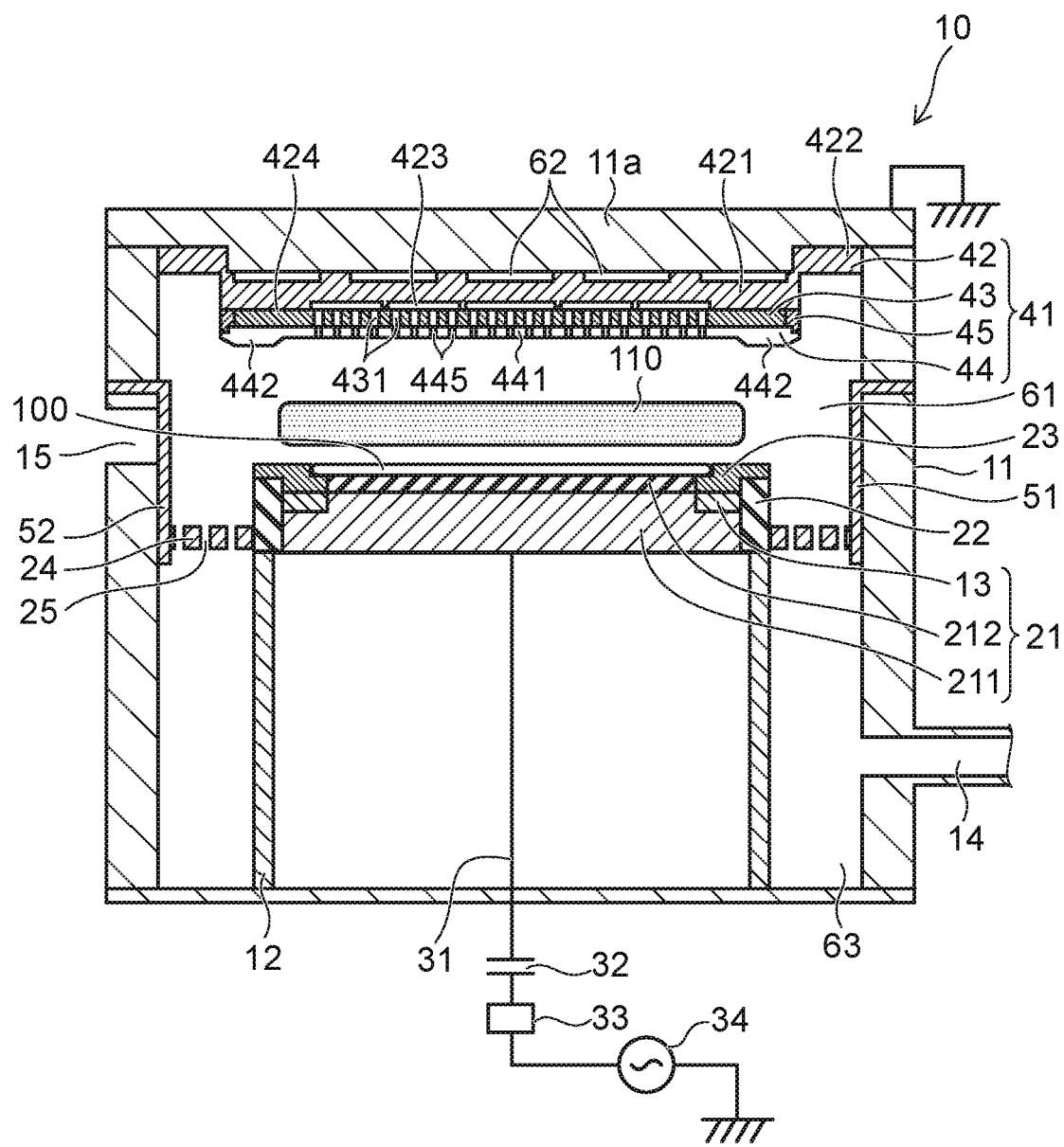
FIG. 1 is a cross-sectional view schematically showing an example of a configuration of a plasma processing apparatus according to an embodiment.
Figure 2A:
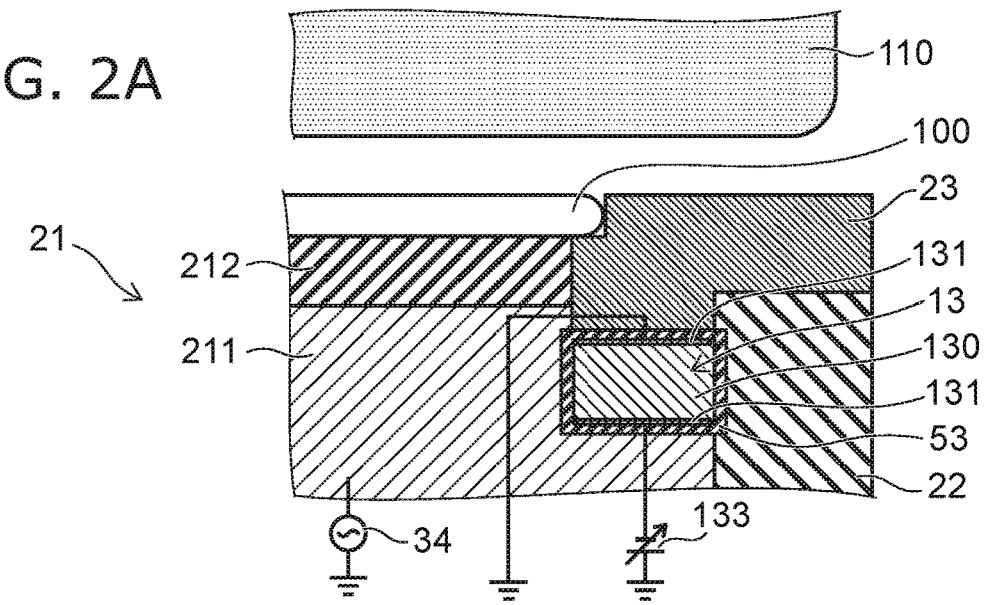
FIGS. 2A to 2C are drawings for describing a processing object support platform according to the embodiment.
Figure 2B:
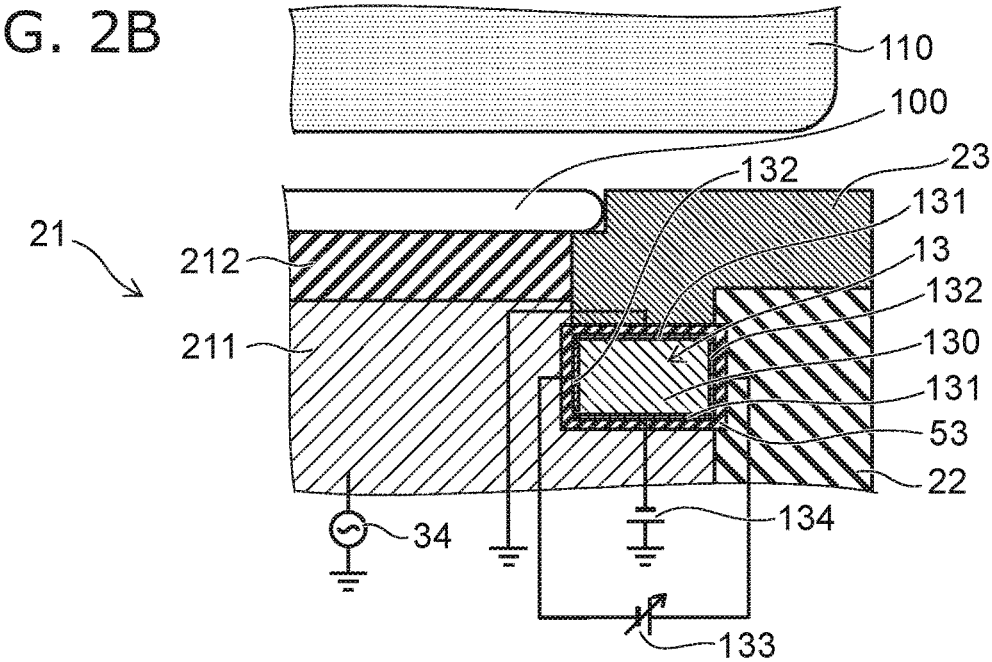
Figure 2C:
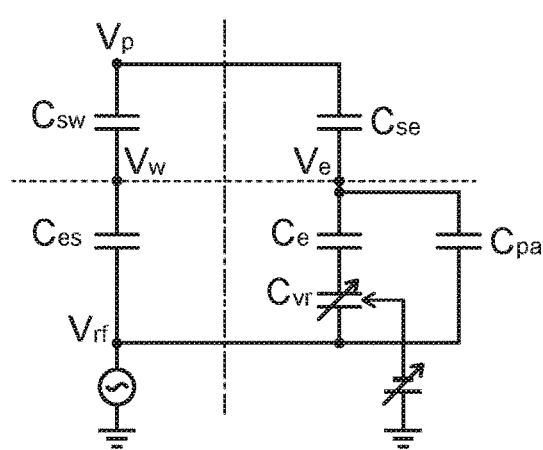

FIG. 1 is a cross-sectional view schematically showing an example of the configuration of the plasma processing apparatus according to the embodiment of the invention; FIGS. 2A to 2C are drawings for describing the processing object support platform according to the embodiment of the invention; FIGS. 2A and 2B are cross-sectional views showing relevant components of one portion of the processing object support platform and the periphery of the processing object support platform; and FIG. 2C is an equivalent circuit diagram of the one portion of the processing object support platform and the periphery of the processing object support platform. Here, an RIE apparatus is illustrated as the plasma processing apparatus 10.

The plasma processing apparatus 10 includes, for example, a chamber 11 that is made of aluminum and configured to be airtight. A support table 21, which is a processing object support platform that horizontally supports a wafer 100 as the processing object, is provided inside the chamber 11. The support table 21 functions also as an electrostatic chuck device that chucks the wafer 100 onto a placement surface of the support table 21. The main body portion of the support table 21 is made of a lower plate 211 and an upper plate 212; the lower plate 211 is electrically conductive and is used as a base plate of the electrostatic chuck device and as an electrode supplying electrical power for generating plasma inside the chamber 11; the wafer 100 is placed on the upper surface of the upper plate 212; and the upper plate 212 has an electrostatic chuck mechanism that electrostatically holds the wafer 100. For example, the upper plate 212 is made of a dielectric such as alumina, etc.; and a not-illustrated chuck electrode is buried in the interior of the upper plate 212.

High frequency power of a prescribed frequency is supplied in the plasma processing from a high frequency power supply 34 used as an RF power supply to the lower plate 211 of the support table 21 that functions as the lower electrode of the parallel plate-type RIE apparatus. Specifically, a power supply line 31 that supplies the high frequency power is connected to the lower plate 211; and a blocking capacitor 32, a matching unit 33, and the high frequency power supply 34 are connected to the power supply line 31. The lower plate 211 is made of an upper portion positioned on the upper plate 212 side and having substantially the same outer diameter as the upper plate 212, and a lower portion having a larger outer diameter than the upper portion; and the lower plate 211 includes a stepped portion between the upper portion and the lower portion. Here, the lower plate 211 is made of a metal such as aluminum, etc.; and, for example, the upper portion and the lower portion are formed as one body of aluminum, etc. A variable condenser 13 is further disposed in the support table 21 along the circumferential direction of the lower plate 211 at the stepped portion between the upper portion and the lower portion of the lower plate 211. The periphery of the variable condenser 13 is covered with an insulating member 53 as shown in FIGS. 2A and 2B and is electrically insulated from the electrically conductive peripheral parts such as the lower plate 211, etc. The detailed structure of the variable condenser 13 is described below.

An insulator ring 22 that is made of an insulating material such as quartz, etc., is provided to cover the side surface circumferential edge portion of the support table 21. The insulator ring 22 electrically insulates the variable condenser 13, a baffle plate 24, the lower plate 211, etc., from each other and protects the support table 21 and the variable condenser 13 from the atmosphere inside the chamber 11 in the etching processing. An edge ring 23 that is made of silicon, SiC (silicon carbide), quartz, etc., is provided at the outer circumference above the support table 21 covered with the insulator ring 22. The edge ring 23 is a member provided to adjust the electric field in the etching of the wafer 100 so that the electric field is not deflected with respect to the perpendicular direction (the direction perpendicular to the wafer surface) at the circumferential edge portion of the wafer 100. Because the edge ring 23 is consumed due to collisions of ions inside the plasma when used, the edge ring 23 is a consumable part that is replaced with a new edge ring 23 after being used for a prescribed interval and may be replaced with an unused part, for example, each time apparatus maintenance is performed.

The edge ring placement surface where the edge ring 23 is placed is formed from the upper surface of the insulator ring 22 and the upper surface of the variable condenser 13. The insulator ring 22 has a thickness such that the upper surface of the insulator ring 22 protrudes to be higher than the upper surface of the variable condenser 13; and a stepped portion is formed between the upper surface of the insulator ring 22 and the upper surface of the variable condenser 13. A difference in levels is formed also in the bottom surface of the edge ring 23; and movement in the horizontal direction of the edge ring 23 placed on the support table 21 is suppressed by placing the edge ring 23 so that the difference in levels of the edge ring 23 bottom surface engages the stepped portion between the upper surface of the insulator ring 22 and the upper surface of the variable condenser 13.

The support table 21 is supported on a supporter 12 protruding in a tubular configuration upward in the perpendicular direction from the bottom wall at the central vicinity of the chamber 11. A baffle plate 24 is disposed between the insulator ring 22 and the side wall of the chamber 11. The baffle plate 24 has multiple gas exhaust holes 25 piercing the plate in the thickness direction.

A shower head 41 is provided as a gas supply unit to oppose the support table 21 upper surface. The upper surface of the support table 21 and the lower surface of the shower head 41 are provided to be separated by a prescribed distance. The shower head 41 includes an upper electrode 44 as described below. In other words, the shower head 41 functions also as an electrode of the RIE apparatus; and a pair of parallel-plate electrodes is configured of the shower head 41 and the lower plate 211 of the support table 21.

A not-illustrated gas supply port is provided at the upper portion vicinity of the chamber 11. A not-illustrated gas supply apparatus is connected to the gas supply port via a pipe. The gas supply apparatus introduces the processing gas into the chamber 11 from the gas supply port via the shower head 41 in the plasma processing.

A gas exhaust port 14 is provided in the chamber 11 in a portion lower than the support table 21 and the baffle plate 24. A not-illustrated vacuum pump is connected to the gas exhaust port 14 via a pipe. In the plasma processing, the interior of the chamber 11 is set to a prescribed degree of vacuum by the vacuum pump.

A deposition shield 51 that prevents the adhesion of reaction products generated in the plasma processing to the chamber 11 side wall is provided at the side wall of the chamber 11 in the partitioned region between the baffle plate 24 and the shower head 41. An opening 15 where the wafer 100 enters and exits is formed in the side wall portion at a prescribed position of the chamber 11; and a shutter 52 is provided in the portion of the deposition shield 51 corresponding to the opening 15. The shutter 52 performs the role of partitioning between the exterior and the interior of the chamber 11 and is opened to connect the opening 15 and the interior of the chamber 11 when the wafer 100 enters and exits.

The interior of the plasma processing apparatus 10 having such a configuration can be divided into a plasma processing chamber 61, a gas supply chamber 62, and a gas exhaust chamber 63. The plasma processing chamber 61 is the region inside the chamber 11 that is partitioned by the support table 21, the baffle plate 24, and the shower head 41. The gas supply chamber 62 is the region of the upper portion inside the chamber 11 partitioned by the shower head 41. The gas exhaust chamber 63 is the region of the lower portion inside the chamber 11 that is partitioned by the supporter 12 and the baffle plate 24.

The shower head 41 includes a cooling plate 42, a back plate 43, the upper electrode 44, and a guard ring 45. The shower head 41 is fixed by a not-illustrated fixture to a top plate 11a included in the upper portion of the chamber 11. The top plate 11a is set to the ground potential in the plasma processing.

The cooling plate 42 has a structure in which a coolant such as water, etc., at a prescribed temperature is supplied from the outside and circulated so that the back plate 43 and the upper electrode 44 are at a prescribed temperature even in the plasma processing. The cooling plate 42 includes, for example, stainless steel. The cooling plate 42 includes an electrode holder 421 and a supporter 422. The electrode holder 421 is the portion that holds the structure body made of the back plate 43, the upper electrode 44, and the guard ring 45. The supporter 422 is fixed to the top plate 11a of the chamber 11.

The electrode holder 421 protrudes toward the support table 21 side with respect to the supporter 422. A trench 423 is formed in the region corresponding to the wafer placement region of the electrode holder 421. The trench 423 performs the role of a plenum chamber due to the back plate 43 being disposed. The trench 423 and the gas supply chamber 62 are connected by a not-illustrated gas flow channel. A flat portion 424 is provided at the outer circumference of the placement region of the trench 423 of the electrode holder 421.

For example, the back plate 43 is made of a member having a disk configuration having a substantially uniform thickness and is provided on the support table 21 side of the electrode holder 421 of the cooling plate 42. The back plate 43 is made of a material having good thermal conductivity and electrical conductivity so that the upper electrode 44 is cooled by the cooling plate 42, and so that the upper electrode 44 is set to the ground potential. The back plate 43 includes, for example, aluminum, an aluminum alloy, etc.

Gas flow channels 431 that pierce the back plate 43 in the thickness direction are two-dimensionally arranged in the region of the back plate 43 corresponding to the placement region of the wafer 100. The back plate 43 is fixed to the cooling plate 42 by a not-illustrated fixture so that the circumferential edge region of the placement region of the gas flow channels 431 overlaps the flat portion 424 of the cooling plate 42. The thermal and electrical conduction between the cooling plate 42 and the back plate 43 is provided by the contact between the back plate 43 and the flat portion 424 of the cooling plate 42.

The upper electrode 44 is provided in contact with the back plate 43 on the support table 21 side of the back plate 43 and is fixed to the back plate 43 by a not-illustrated fixture. The upper electrode 44 includes silicon, etc. The upper electrode 44 is made of a member having a disk configuration that is flat on the back plate 43 side but includes a gas flow channel placement portion 441 and a protruding portion 442 on the support table 21 side.

The gas flow channel placement portion 441 is the region inside the member having the disk configuration that corresponds to the placement region of the wafer 100, and has a substantially constant thickness. Gas flow channels 445 that pierce the member having the disk configuration in the thickness direction are two-dimensionally arranged in the gas flow channel placement portion 441. The gas flow channels 445 are provided to match the positions of the gas flow channels 431 of the back plate 43 when the upper electrode 44 is aligned with the back plate 43 and the upper electrode 44 is fixed to the back plate 43. Here, the case is shown where the diameters of the gas flow channels 445 of the upper electrode 44 are set to be smaller than the diameters of the gas flow channels 431 of the back plate 43.

The protruding portion 442 is positioned inside the member having the disk configuration on the outer side of the gas flow channel placement portion 441 and has a thickness that is thick compared to the gas flow channel placement portion 441. The maximum thickness of the protruding portion 442 may be, for example, about 1.5 to 2 times the thickness of the gas flow channel placement portion 441. The protruding portion 442 functions in the plasma processing to suppress the undesirable spreading of plasma 110 from the circumferential edge portion of the wafer 100 toward the outer side. The protruding portion 442 is provided at a position opposing the insulator ring 22 with the edge ring 23 interposed.

The guard ring 45 is provided at the outer circumferential portion of the back plate 43 in a region interposed between the cooling plate 42 and the upper electrode 44. A not-illustrated confinement ring that traps the plasma may be provided at a prescribed distance at the outer circumferential portion of the structure body in which the upper electrode 44, the back plate 43, and the electrode holder 421 of the cooling plate 42 overlap. For example, the confinement ring has a ring configuration; and the inner diameter of the confinement ring is slightly larger than the diameter of the upper electrode 44 (the electrode holder 421).

The structure of the variable condenser 13 of the support table 21 and the periphery of the variable condenser 13 will now be described. In an example of the variable condenser 13 as shown in FIG. 2A, the variable condenser 13 has a structure in which a variable capacitance unit 130 is held between a pair of counter electrodes 131 and 131; and a power supply 133 that supplies a control voltage for the capacitance control of the variable capacitance unit 130 to the variable capacitance unit 130 is connected between the counter electrodes 131 and 131. The variable condenser 13 is mounted at the stepped portion of the lower plate 211 of the support table 21 to have an orientation such that one of the counter electrodes 131 and 131 is on the lower side and the other is on the upper side so that the electric field between the pair of counter electrodes 131 and 131 is formed along the direction of the electric field of the circumferential edge portion of the wafer 100.

In another example of the variable condenser 13 shown in FIG. 2B, a pair of control electrodes 132 and 132 that supply the control voltage for the capacitance control of the variable capacitance unit 130 to the variable capacitance unit 130 is provided separately from the pair of counter electrodes 131 and 131 such as that described above. In such a case, a power supply 134 that supplies a prescribed bias voltage to the variable capacitance unit 130 is connected between the counter electrodes 131 and 131; and the power supply 133 for supplying the control voltage for the capacitance control of the variable capacitance unit 130 to the variable capacitance unit 130 is connected between the pair of control electrodes 132 and 132. Here, although the pair of control electrodes 132 and 132 is formed on the side surface side of the variable condenser 13, the positions of the control electrodes 132 and 132 are not particularly limited as long as the positions do not interfere with the counter electrodes 131 and 131.

In the support table 21 shown in FIGS. 2A and 2B, the variable condenser 13 is mounted in the region having the circular ring configuration (annular configuration) directly under the edge ring 23 which is the member for adjusting the electric field at the circumferential edge portion of the wafer 100; and the capacitance of the variable capacitance unit 130 is variable by the control voltage applied to the counter electrodes 131 and 131 or the control electrodes 132 and 132. Because the electric field reaching the circumferential edge portion of the wafer 100 via the variable capacitance unit 130 is dependent on the capacitance value of the variable capacitance unit 130, by adjusting the value of the control voltage of the variable capacitance unit 130, the electric field fluctuation at the circumferential edge portion of the wafer 100 due to the shape deformation of the edge ring 23 can be compensated; and the effects on the etching characteristics such as the etched configuration and the etching rate can be suppressed.

Specifically, the voltage from the high frequency power supply 34 for the plasma generation that is supplied to the lower plate 211 of the support table 21 is applied to the edge ring 23 via the variable condenser 13. According to the equivalent circuit diagram shown in FIG. 2C, it can be seen that the potential of the edge ring 23 surface is determined according to the capacitance of the variable capacitance unit 130. In such a case, if the potential of the edge ring 23 surface is controlled by the capacitance value of the variable capacitance unit 130 so that the equipotential surface of the sheath edge of the plasma 110 is formed at substantially the same height on the wafer 100 and on the edge ring 23, the incident direction of the ions inside the plasma on the wafer 100 surface can be aligned in the perpendicular direction even at the circumferential edge portion of the wafer 100; and even the uniformity in the surface of the etching characteristics can be improved. In FIG. 2C, the left side of the single dot-dash line extending up and down is an equivalent circuit of the wafer 100 placement region on the upper plate 212 (the electrostatic chuck mechanism) of the support table 21; the right side of the single dot-dash line is an equivalent circuit of the edge ring 23 placement region on the variable condenser 13; and the broken line that extends left and right corresponds to the position of the upper surfaces of the wafer 100 and the edge ring 23. Vp, Vw, Ve, and Vrf in the drawing respectively show the potential of the sheath edge of the plasma 110, the potential of the wafer 100 surface, the potential of the edge ring 23 surface, and the potential of the lower plate 211 of the support table 21 to which the high frequency power supply 34 is connected; and Ces, Cvr, Ce, Csw, and Cse show the capacitance of the upper plate 212 (the electrostatic chuck mechanism) of the support table 21, the variable capacitance of the variable condenser 13, the capacitance of the edge ring 23, the capacitance of the sheath formed at the surface of the wafer 100, and the capacitance of the sheath formed at the surface of the edge ring 23. Cpa in the drawing shows a parasitic capacitance that is caused by the insulator ring 22, etc., and is interposed, in parallel with the variable capacitance of the variable condenser 13, between the edge ring 23 and the lower plate 211 of the support table 21.

Although the lower plate 211 of the support table 21 described above has a two-step configuration including the upper portion and the lower portion that has a larger outer diameter than the upper portion, the lower plate 211 may have a circular columnar configuration in which the outer diameter is substantially equal above and below. Although the support table 21 according to the embodiment is such that the lower portion of the lower plate 211 is formed to have an outer diameter larger than the upper portion and the variable condenser 13 is mounted on the protruding portion of the lower portion of the lower plate 211, from the perspective of the ease of the mount of the variable condenser 13, a circuit that is the equivalent of that shown in FIG. 2C can be formed even if the lower portion of the lower plate 211 has a configuration that does not protrude below the variable condenser 13. In such a case, the bottom portion of the insulator ring 22 may be caused to protrude toward the lower portion of the lower plate 211 so that the side surface and bottom surface side of the variable condenser 13 are protected from the atmosphere inside the chamber 11 in the etching processing; and the variable condenser 13 may be mounted on the protruding portion of the bottom portion of the insulator ring 22. Or, the variable condenser 13 may be fixed to the upper outer circumference of the lower plate.

Figure 3A:
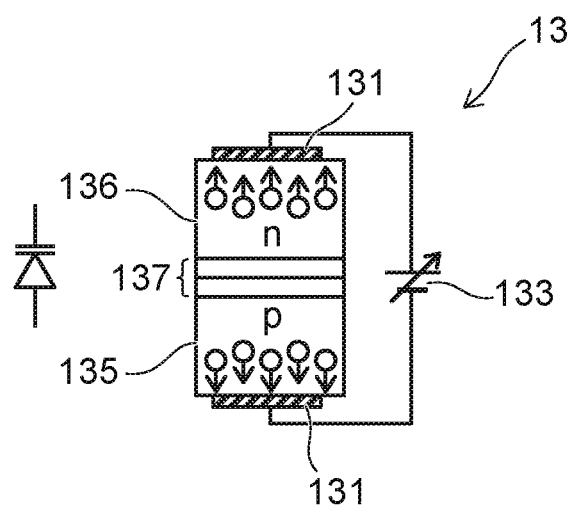
FIGS. 3A and 3B are drawings showing an element structure of a variable condenser according to the embodiment.
Figure 3B:
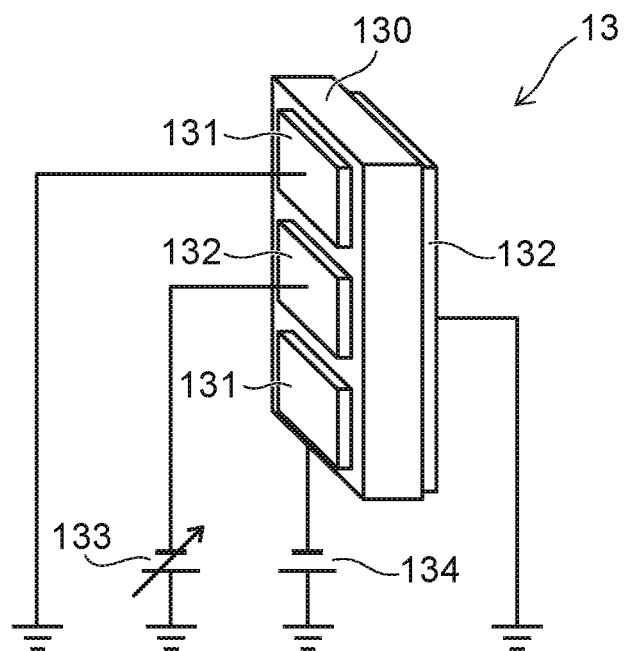

Here, the element structure of the variable condenser according to the embodiment is shown in FIGS. 3A and 3B. FIG. 3A is a cross-sectional view showing an example of the element structure of the variable condenser 13 that is useable in the support table 21 shown in FIG. 2A. The variable condenser 13 is a variable capacitance diode in which a p-n junction-type diode which is the variable capacitance unit 130 is provided between the pair of counter electrodes 131 and 131. Here, when a reverse voltage is applied to the p-n junction of the variable capacitance unit 130 by the power supply 133 connected to the counter electrodes 131 and 131, a depletion layer 137 spreads between a p-type semiconductor 135 and an n-type semiconductor 136. Because the degree of the spreading of the depletion layer 137 is dependent on the magnitude of the reverse voltage that is applied, it is possible to obtain a capacitance value that is variable according to the control voltage value of the variable capacitance unit 130 to which the control voltage is supplied.

FIG. 3B is a perspective view showing an example of the element structure of the variable condenser 13 that is useable in the support table 21 shown in FIG. 2B. Here, in the variable condenser 13, the variable capacitance unit 130 includes a ferroelectric such as barium strontium titanate, barium titanate, etc.; and the capacitance value of the variable capacitance unit 130 changes due to the transition of the polarized state of the crystal of the ferroelectric occurring due to the voltage applied to the variable capacitance unit 130. Because the polarized state of the crystal of the ferroelectric has a correlation with the magnitude of the voltage applied to the ferroelectric, such a variable condenser 13 has a capacitance value that is variable according to the control voltage value supplied via the pair of control electrodes 132 and 132 which is the control terminals.

In the case where the variable capacitance unit 130 includes a ferroelectric, the power supply 134 that supplies the prescribed bias voltage between the pair of counter electrodes 131 and 131 corresponding to the two terminals of the positive pole and negative pole is connected; and the polarized state of the crystal of the ferroelectric also can be controlled directly by the application of the bias voltage to the variable capacitance unit 130. For the variable condenser 13 shown in FIG. 2B and FIG. 3B, even in the case where the power supply 134 that supplies the bias voltage is not connected, the capacitance of the variable condenser 13 can be controlled without any particular problem by the power supply 133 for supplying the control voltage to the variable capacitance unit 130.

Accordingly, in the variable condenser 13 that is applied to the support table 21 shown in FIG. 2A, the variable capacitance unit 130 that is made of a ferroelectric such as barium strontium titanate, barium titanate, etc., may be used instead of the variable capacitance diode. Generally, from the aspect of obtaining the variable range of the capacitance value over a wide range, a ferroelectric in which the polarized state of the crystal is caused to transition can be used favorably as the variable capacitance unit 130 of the variable condenser 13 compared to a p-n junction-type diode in which the capacitance value is determined by the degree of the spreading of the depletion layer.

Figure 4A:
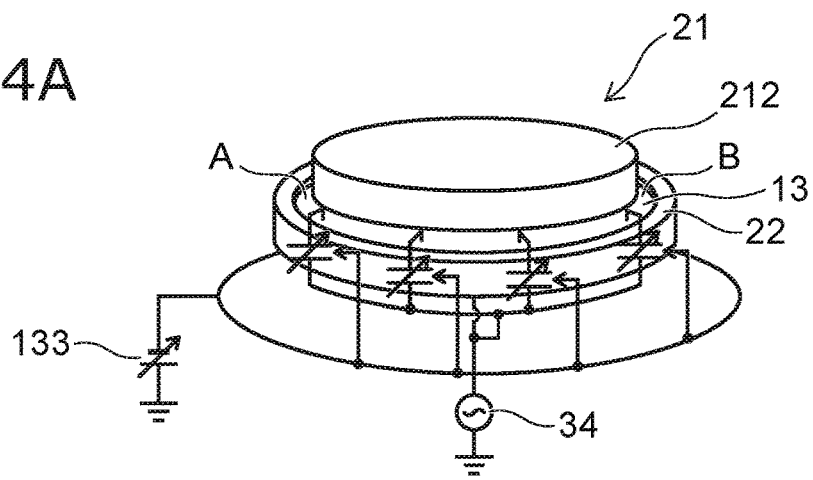
FIGS. 4A to 4C are drawings schematically showing an entire processing object support platform according to the embodiment.
Figure 4B:
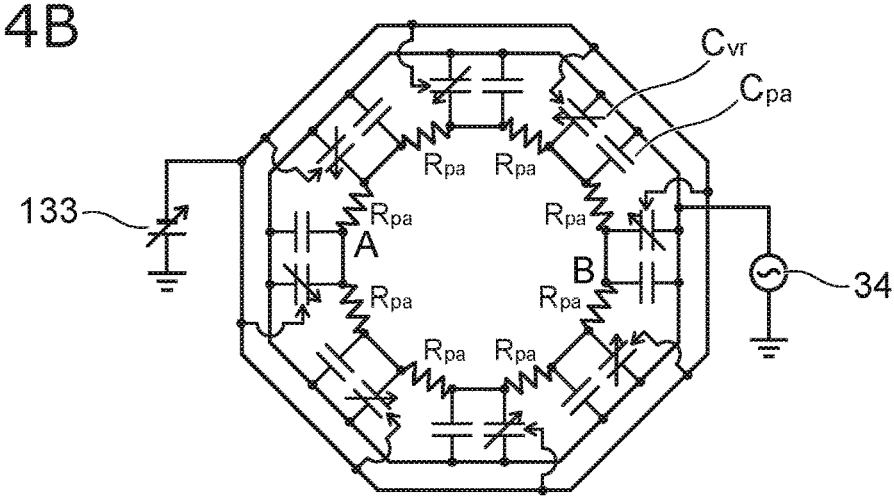
Figure 4C:
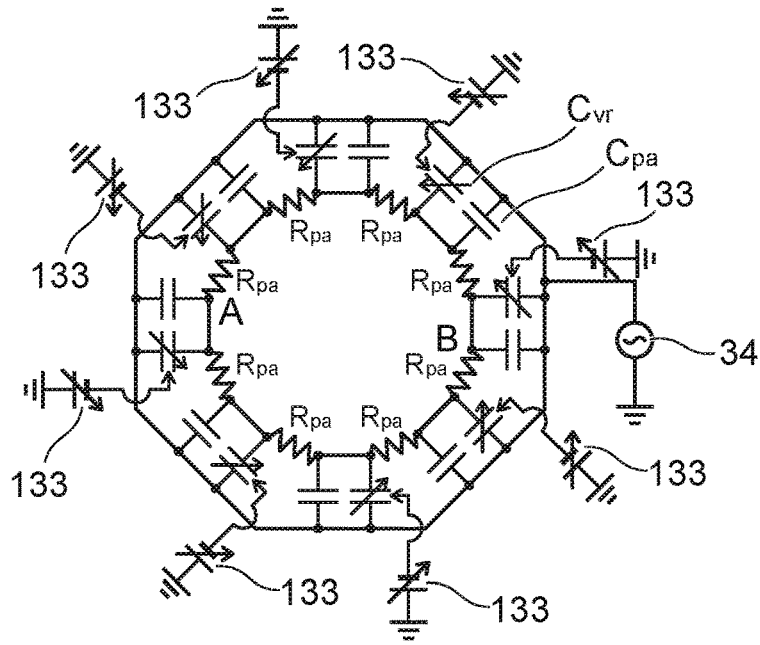

In the support table 21 according to the embodiment, the variable condenser 13 is disposed uniformly below the edge ring 23 having the circular ring configuration. FIGS. 4A to 4C are drawings schematically showing the entire processing object support platform according to the embodiment; FIG. 4A is a perspective view; FIG. 4B is an equivalent circuit diagram; and FIG. 4C is another equivalent circuit diagram. FIG. 4A shows the state before placing the wafer 100 and the edge ring 23 on the support table 21 for easier viewing of the drawing. In FIGS. 4B and 4C, the same constituents as those of the equivalent circuit diagram shown in FIG. 2C are marked with the same reference numerals; and a description thereof is omitted as appropriate.

For example, as shown in FIG. 4B, eight variable condensers 13 are provided in the circumferential direction of the support table 21. Thus, fluctuation of the etching characteristics along the circumferential direction of the circumferential edge portion of the wafer 100 can be suppressed by arranging the multiple variable condensers 13 along the circumferential edge portion of the wafer 100 and conjunctively controlling the capacitance values of the multiple variable condensers 13. Conversely, a circuit configuration may be imagined in which a power supply for the potential control of the edge ring 23 other than the high frequency power supply 34 for the plasma generation is mounted in the support table 21; and the variable condenser 13 that is further provided externally is interposed inside a power supply cable connecting the edge ring 23 to the power supply for the potential control of the edge ring 23. Here, for example, a potential that has a value controlled according to the capacitance of the externally-provided variable condenser 13 is directly supplied to a circumferential edge portion A shown in FIGS. 4A and 4B.

Thus, in the case where the variable condenser 13, the power supply cable and the power supply for the potential control of the edge ring 23 are provided externally with respect to the support table 21, even if the potential of the edge ring 23 can be controlled with high precision at the circumferential edge portion A described above, it is extremely difficult to perform high-precision potential control over the entire circumference of the edge ring 23 due to a parasitic resistance Rpa of the edge ring 23 itself. In particular, a large potential drop is undesirably caused by the parasitic resistance Rpa between the circumferential edge portion A and a circumferential edge portion B shown in FIGS. 4A and 4B, i.e., the circumferential edge portion of the edge ring 23 having the circular ring configuration most distal to the circumferential edge portion A and opposing the circumferential edge portion A with the center point of the edge ring 23 having the circular ring configuration interposed; and as a result, it is exceedingly difficult to make the etching characteristics uniform between the circumferential edge portions of the wafer 100 corresponding to the circumferential edge portions A and B.

On the other hand, in the support table 21 according to the embodiment, because the variable condenser 13 is disposed uniformly in the region having the circular ring configuration below the edge ring 23 having the circular ring configuration, the effects of the parasitic resistance Rpa of the edge ring 23 on the potentials of the circumferential edge portions of the edge ring 23 are small enough to be ignored. Accordingly, it is easy to perform high-precision potential control over the entire circumference of the edge ring 23 and to make the etching characteristics uniform over the entire circumferential edge portion of the wafer 100. Even in the case where the power supply and the variable condenser 13 are provided separately and externally via a power supply cable for the potential control of the edge ring 23 for the support table 21 as described above, for example, if electrode terminals for the potential control are provided uniformly at the entire circumferential edge portion of the edge ring 23 having the circular ring configuration and if the potential via the variable condenser 13 is directly supplied to the entire circumferential edge portion of the edge ring 23, the effects of the parasitic resistance Rpa of the edge ring 23 can be eliminated; and it is possible to perform high-precision potential control over the entire circumference of the edge ring 23. However, the addition of new constituents such as electrode terminals to the edge ring 23 which is a consumable part that is replaced with an unused part every prescribed interval of use is not realistic and simply causes an increase of the cost of the processing by the plasma processing apparatus 10.

Although an example is shown in FIGS. 4A to 4C in which eight variable condensers 13 are provided in the circumferential direction of the support table 21, the number of the variable condensers 13 is not limited thereto; for example, it is sufficient for n (n being an integer not less than 2) variable condensers 13 to be arranged along the circumferential direction in the support table 21. From the perspective of making the etching characteristics of the circumferential edge portion of the wafer 100 uniform, it is desirable for the number of the variable condensers 13 to be as high as possible; and it is desirable for the n variable condensers 13 to be disposed at substantially uniform spacing along the circumferential direction in the support table 21. In such a case, the n variable condensers 13 may be provided along the circumferential direction of the lower plate 211 of the support table 21 in a state in which the peripheries of the n variable condensers 13 are covered with the insulating member 53 such as that shown in FIGS. 2A and 2B.

Although the same control voltage is supplied from one power supply 133 to the eight variable condensers 13 along the circumferential direction of the support table 21 in the equivalent circuit shown in FIG. 4B, a circuit configuration may be used in which the control voltages are supplied to the n variable condensers 13 from two or more power supplies 133 as shown in FIG. 4C. For example, even in the case where the etching processing is performed in the state in which the edge ring 23 that is not consumed is placed on the support table 21, there is a risk that etching characteristic fluctuation caused by the apparatus may occur in the circumferential direction of the wafer 100. In such a case, it is possible to correct the etching characteristic fluctuation in the circumferential direction of the wafer 100 by performing local electric field adjustment along the circumferential edge portion vicinity of the wafer 100 by supplying control voltages having mutually-different values between the multiple variable condensers 13 (capacitance elements)

arranged along the circumferential direction of the support table 21. Further, any etching characteristic fluctuation caused by the apparatus and factors over time can be suppressed by changing the values of the control voltages supplied to the variable condensers 13 from the multiple power supplies 133 to compensate the electric field fluctuation over time at the circumferential edge portion of the wafer 100 due to the shape deformation of the edge ring 23; and the uniformity in the surface of the etching characteristics can be exceedingly good.

A circuit configuration is shown in the equivalent circuit shown in FIG. 4C in which control voltages having individual values are suppliable from the n power supplies 133 to the n variable condensers 13 arranged along the circumferential direction of the support table 21. However, the power supplies 133 that supply the control voltages are not limited to the case where the same number as the variable condensers 13 is provided; and a circuit configuration may be used in which the n variable condensers correspond to any m (m being an integer not less than 2 satisfying m<n) groups; and the control voltages having individual values are supplied from the m power supplies 133 to the m groups. For example, the region having the circular ring configuration where the n variable condensers are disposed is divided into m zones along the circumferential direction of the support table 21; the m power supplies 133 are provided to correspond to the m zones; the control is performed so that mutually-different control voltages are supplied from other power supplies 133 to the capacitance elements belonging to different zones, while inside each zone, the control voltage is supplied from the same power supply 133 to the variable condensers 13. By such a control, it is possible to easily perform zone control of the electric field of the circumferential edge portion vicinity of the wafer 100.

On the other hand, in the case where the risk of the etching characteristic fluctuation caused by the apparatus is small and high-precision electric field control such as that described above is not particularly desirable, the variable condenser 13 is not particularly limited to the example in which the variable condensers 13 having singulated configurations are multiply arranged along the circumferential direction of the lower plate 211. For example, the variable condenser 13 may be prepared in which the counter electrode 131, the control electrode 132, and the variable capacitance unit 130 are formed in a circular ring configuration to correspond to the configuration of the edge ring 23; and the variable condenser 13 which itself has a circular ring configuration may be disposed to engage with the upper outer circumference of the lower plate 211. For the variable condenser 13 having such a circular ring configuration as well, in the case where the edge ring 23 is placed on the variable condenser 13, a circuit equivalent to that shown in FIG. 4B can be formed. Or, the variable condenser 13 that has the circular ring configuration may be disposed along the circumferential direction of the support table 21 such that only the variable capacitance unit 130 of the variable condenser 13 has element structures having singulated configurations that are multiply prepared, and common counter electrode 131 and control electrode 132 are formed in circular ring configurations for the variable capacitance units 130 having the multiple singulated configurations.

Figure 5A:
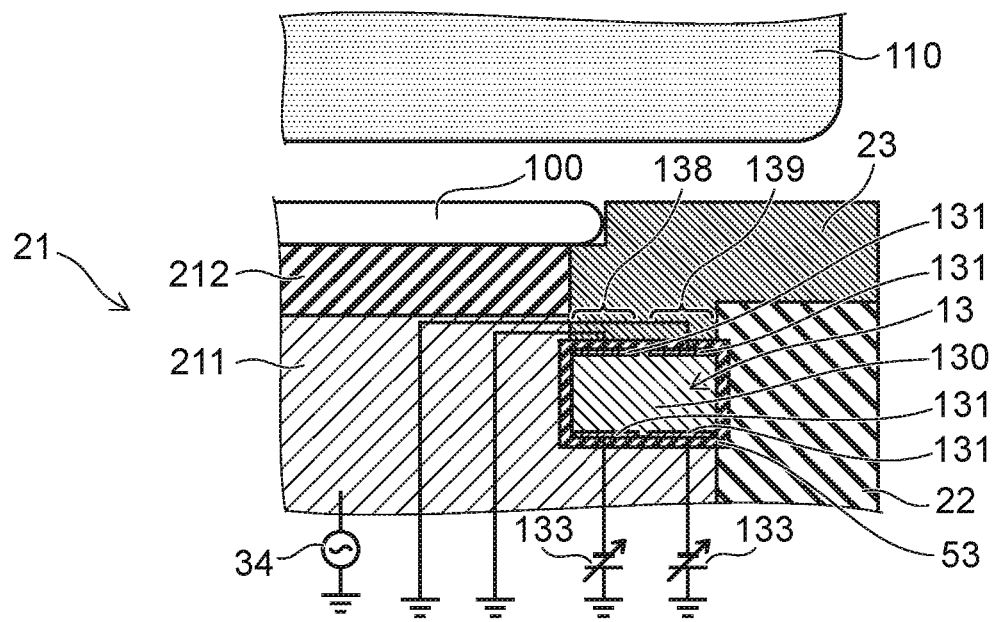
FIGS. 5A and 5B are drawings for describing one specific example of the processing object support platform according to the embodiment.
Figure 5B:
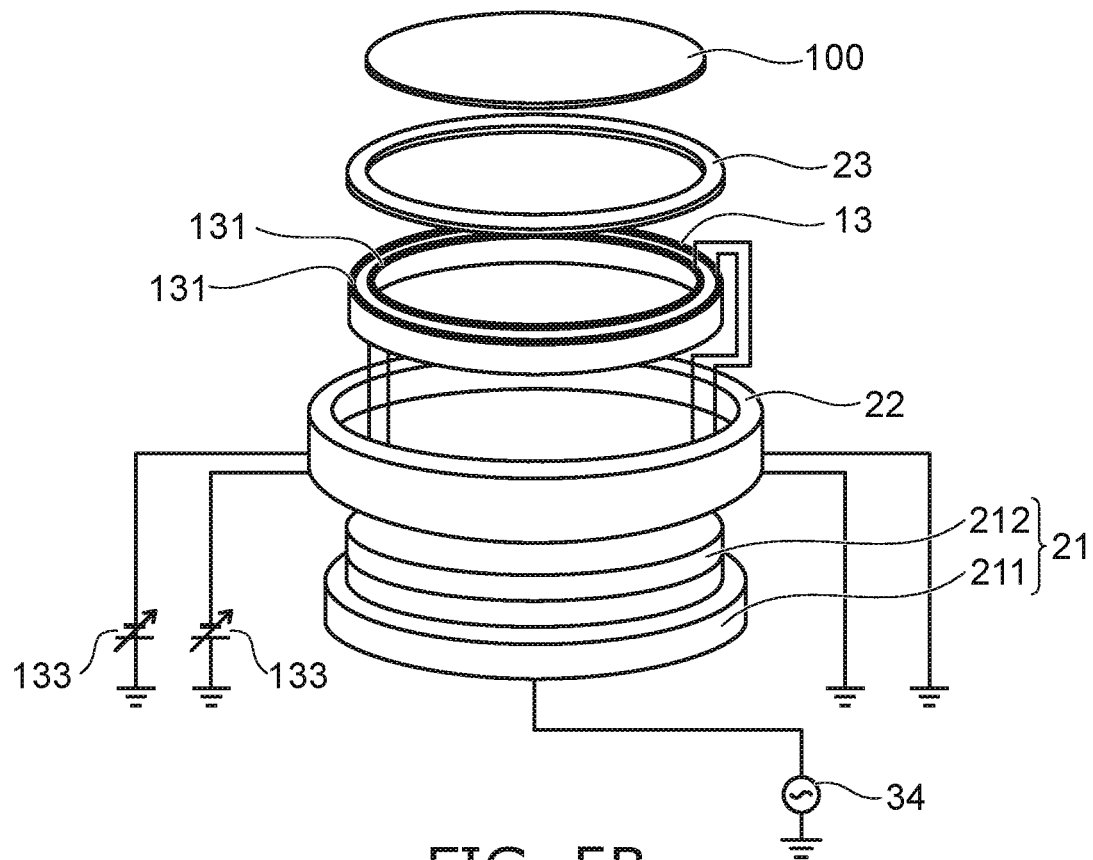
Figure 6A:
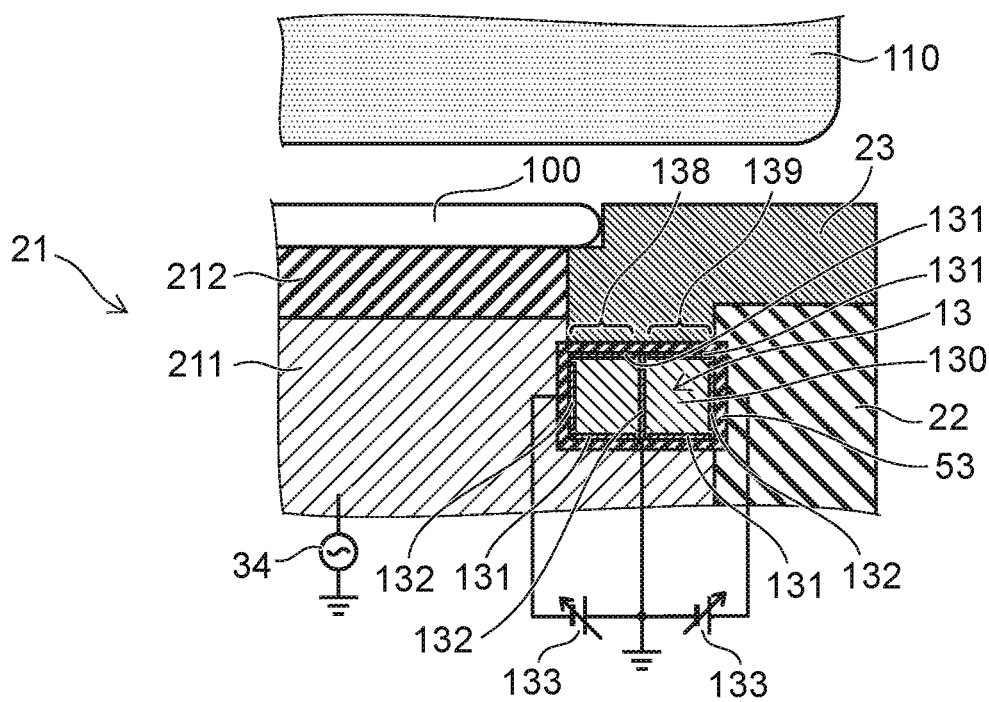
FIGS. 6A and 6B are drawings for describing another specific example of the processing object support platform according to the embodiment.
Figure 6B:
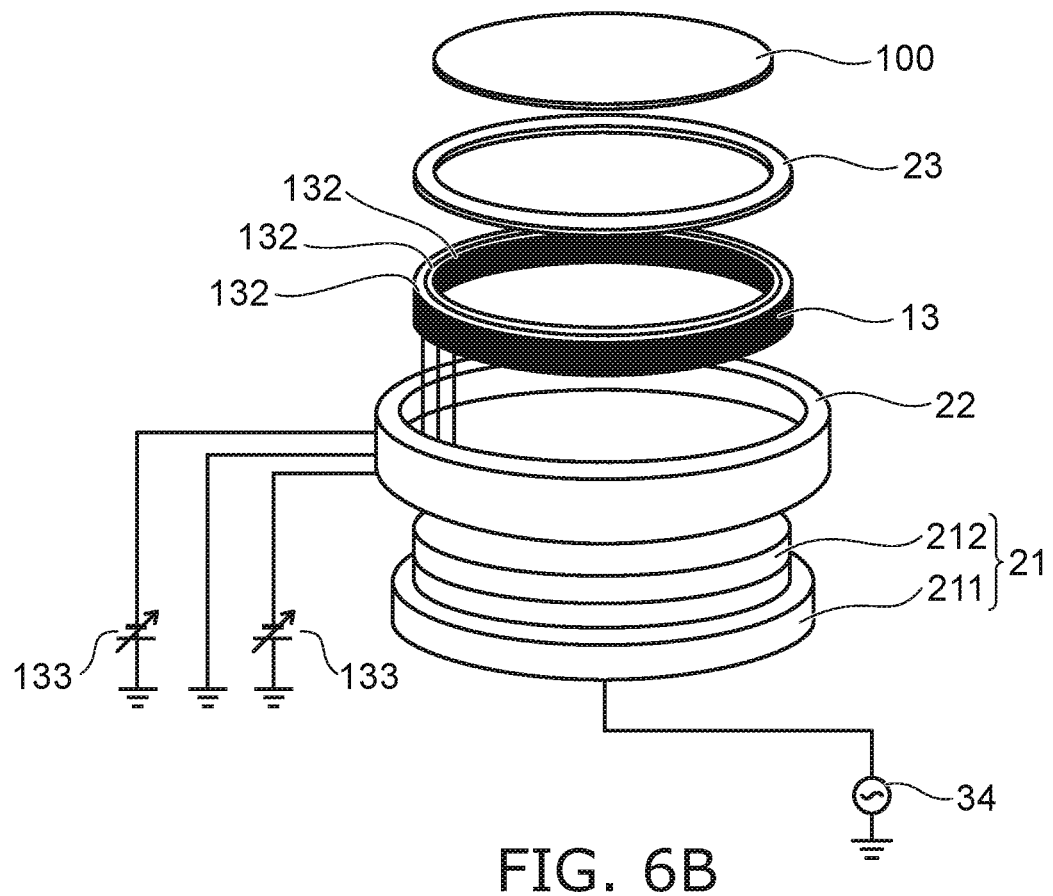
Figure 7:
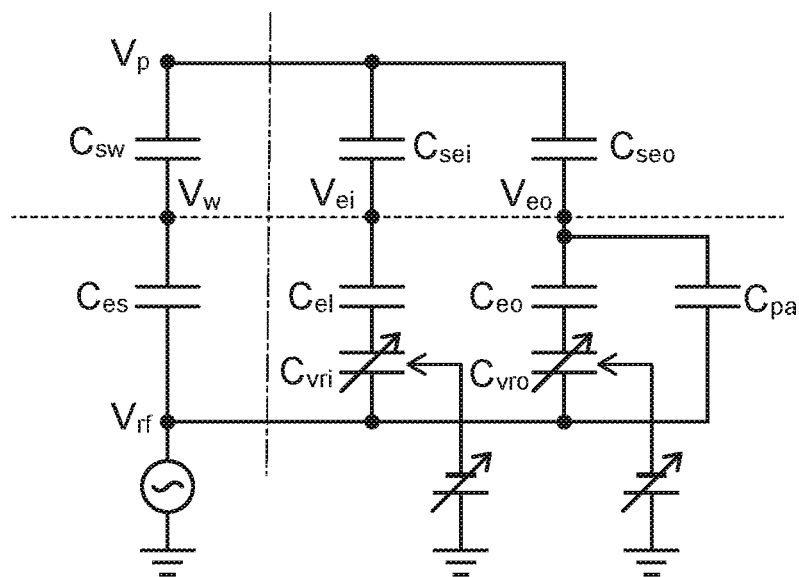
FIG. 7 is an equivalent circuit diagram of the processing object support platform and a periphery of the processing object support platform according to the embodiment.
Figure 10A:
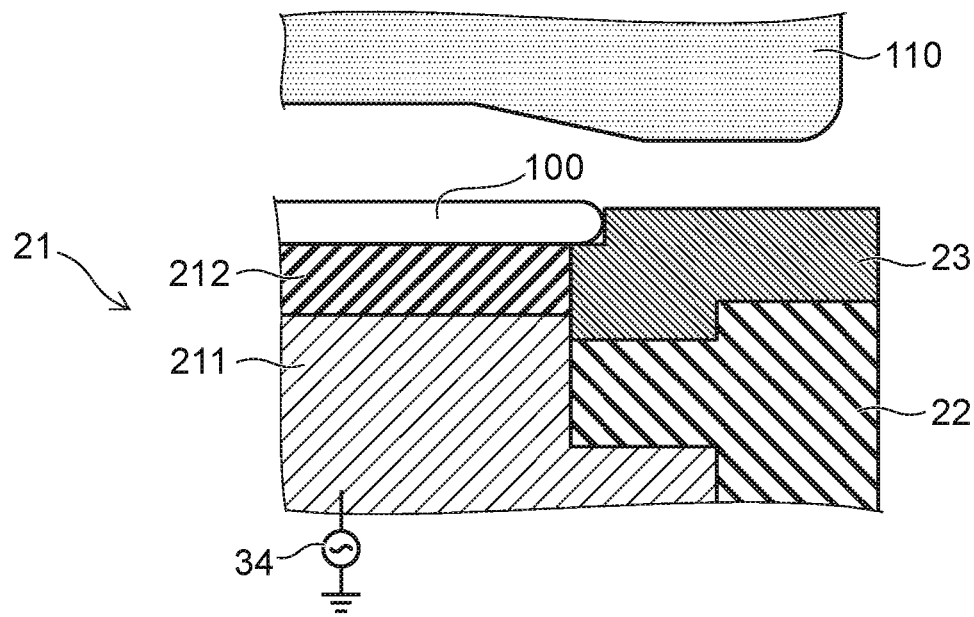
FIGS. 10A and 10B are drawings for describing a processing object support platform and a periphery of the processing object support platform for a reference example.
Figure 10B:
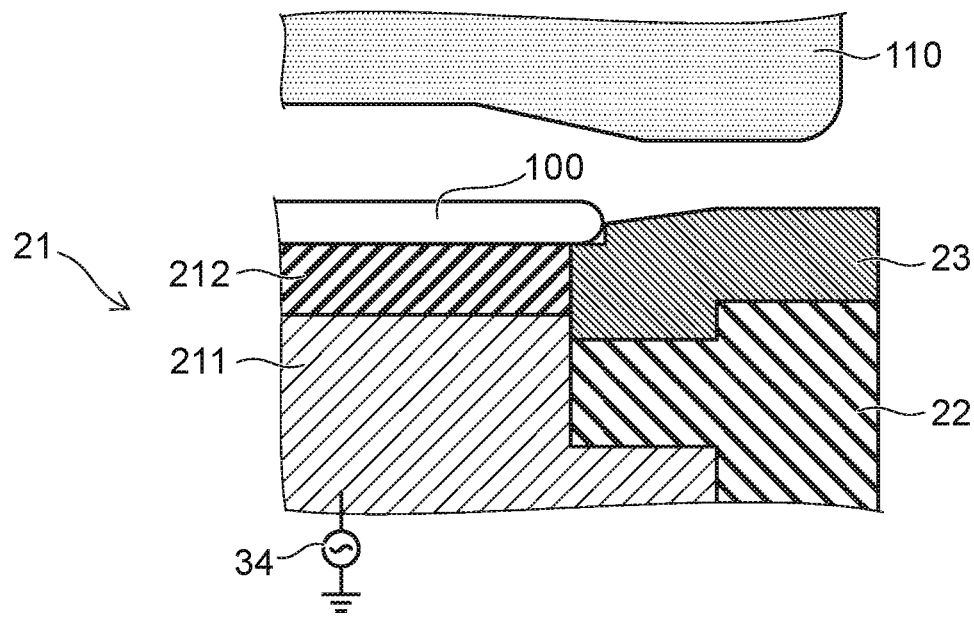

Specific examples of the support table 21 according to the embodiment of the invention will now be described. FIGS. 5A and 5B are drawings for describing one specific example of the processing object support platform according to the embodiment of the invention; FIG. 5A is a cross-sectional view showing relevant components of the processing object support platform and the periphery of the processing object support platform; and FIG. 5B is a perspective view showing the disassembled constituents of the processing object support platform and the periphery of the processing object support platform. FIGS. 6A and 6B are drawings for describing another specific example of the processing object support platform according to the embodiment of the invention; FIG. 6A is a cross-sectional view showing relevant components of the processing object support platform and the periphery of the processing object support platform; and FIG. 6B is a perspective view showing the disassembled constituents of the processing object support platform and the periphery of the processing object support platform. FIG. 7 is an equivalent circuit diagram of the processing object support platform and the periphery of the processing object support platform according to the embodiment of the invention. FIGS. 10A and 10B are drawings for describing the processing object support platform and the periphery of the processing object support platform for a reference example. Here, the state in which the electric field is distorted at the circumferential edge portion of the wafer 100 by the consumption of the edge ring 23 will be described first with reference to FIGS. 10A and 10B before describing the specific examples of the embodiment of the invention.

In the RIE apparatus, the support table 21, the edge ring 23, etc., are designed so that the equipotential surface of the sheath edge of the plasma 110 is formed at substantially the same height as on the wafer 100 and on the edge ring 23 when patterning by etching is performed directly after replacing the edge ring 23 which normally is a consumable part with an unused part. For example, directly after the edge ring 23 replacement, the edge ring 23 is placed on the insulator ring 22 and the variable condenser 13 forming the placement surface of the edge ring 23 in the support table 21; and when the wafer 100 which is the processing object is placed on the upper plate 212 functioning as the electrostatic chuck mechanism, the upper surface of the wafer 100 and the upper surface of the edge ring 23 are set to have substantially the same height.

From the initial state of such an edge ring 23, as the etching of many wafers 100 is repeated in the RIE apparatus, the edge ring 23 is consumed because the ions inside the plasma 110 also collide with the edge ring 23; and the upper surface of the edge ring 23 recedes. Here, when the edge ring 23 is consumed and the upper surface of the edge ring 23 recedes, the state is reached accordingly as shown in FIG. 10A in which the equipotential surface of the sheath edge of the plasma 110 from the top of the circumferential edge portion of the wafer 100 to the top of the edge ring 23 is distorted. As a result, the line of electric force at the circumferential edge portion vicinity of the wafer 100 has an angle tilted from perpendicular; and because the ions inside the plasma 110 at the circumferential edge portion of the wafer 100 are incident along the direction of the tilted line of electric force, the etching undesirably progresses not perpendicularly with respect to the wafer 100 surface but in a direction oblique to the wafer 100 surface. In other words, the holes, trenches, etc., obtained by the etching are formed in a direction tilted from the direction perpendicular to the substrate surface at the circumferential edge portion vicinity of the wafer 100; and fluctuation of the patterned configuration occurs between the central portion and the circumferential edge portion of the wafer 100. Also, the distortion of the electric field at the circumferential edge portion of the wafer 100 may cause nonuniform etching characteristics based on the difference between the etching rates of the central portion and the circumferential edge portion of the wafer 100.

Conversely, in the support table 21 according to the embodiment, the variable condenser 13 is mounted in the region having the circular ring configuration directly under the edge ring 23; and the electric field fluctuation at the circumferential edge portion of the wafer 100 that occurs as the upper surface of the edge ring 23 recedes is compensated by the capacitance adjustment of the variable capacitance unit 130. For example, the control is performed so that the capacitance of the variable condenser 13 directly under the edge ring 23 is increased by the amount that the capacitance of the sheath decreases as the edge ring 23 becomes thinner and the sheath becomes thicker; thereby, the equipotential surface of the sheath edge of the plasma 110 such as that shown in FIG. 2A is maintained in a flat state; and the degradation of the uniformity in the surface of the etching characteristics caused by the consumption of the edge ring 23 can be suppressed.

However, the consumption of the edge ring 23 is not limited to the entire surface of the upper surface receding substantially uniformly at the circumferential edge portion vicinity of the wafer 100 as shown in FIG. 10A; and the inner circumferential side and the outer circumferential side of the edge ring 23 may be consumed with mutually-different recessed amounts as shown in FIG. 10B. In such a case, the appropriate control amount of the capacitance of the variable capacitance unit 130 below the edge ring 23 is dissociated between the inner circumferential side and the outer circumferential side of the edge ring 23; and in the structure of the support table 21 shown in FIGS. 2A to 2C, the compensation of the electric field fluctuation is insufficient for at least one of the inner circumferential side and the outer circumferential side of the edge ring 23; and there is a possibility that a slight distortion of the electric field may occur at the circumferential edge portion of the wafer 100.

Therefore, in the specific examples of the embodiment of the invention, the variable condenser 13 is formed of the set of a first capacitance element 138 on the inner circumferential side and a second capacitance element 139 on the outer circumferential side; and the sets of the first capacitance element 138 and the second capacitance element 139 are arranged uniformly in the region having the circular ring configuration along the circumferential direction of the lower plate 211 of the support table 21. FIGS. 5A and 5B are one specific example of such a support table 21 according to the embodiment and show an example in which the variable condenser 13 having the structure in which the control voltage is applied between the pair of counter electrodes 131 and 131 as shown in FIG. 2A is formed of sets of the first capacitance element 138 on the inner circumferential side and the second capacitance element 139 on the outer circumferential side. FIGS. 6A and 6B are another specific example of the support table 21 according to the embodiment showing an example in which the variable condenser 13 having the structure in which the control voltage is applied to the control electrodes 132 other than the pair of counter electrodes 131 and 131 as shown in FIG. 2B is formed of sets of the first capacitance element 138 on the inner circumferential side and the second capacitance element 139 on the outer circumferential side. In FIG. 6B, the counter electrodes 131 shown in FIG. 6A are not illustrated for easier viewing of the drawing.

Even in the case of FIGS. 5A to 6B, the capacitance value can be controlled separately for the first capacitance element 138 on the inner circumferential side and the second capacitance element 139 on the outer circumferential side as shown in the equivalent circuit diagram FIG. 7; therefore, the capacitance control corresponding to the recessed amount of the inner circumferential side and the outer circumferential side of the edge ring 23 may be performed for each capacitance element. Cvri, Cvro, Cei, Ceo, Csei, and Cseo in FIG. 7 respectively show the capacitance of the first capacitance element 138 on the inner circumferential side, the capacitance of the second capacitance element 139 on the outer circumferential side, the capacitance of the edge ring 23 above the first capacitance element 138, the capacitance of the edge ring 23 above the second capacitance element 139, the capacitance of the sheath above the first capacitance element 138, and the capacitance of the sheath above the second capacitance element 139. For example, in the case where the recess of the inner circumferential side of the edge ring 23 is pronounced compared to that of the outer circumferential side and deformation such as that shown in FIG. 10B occurs in the upper surface of the edge ring 23, it is sufficient to perform the control so that the capacitance Cvri of the first capacitance element 138 on the inner circumferential side is large compared to the capacitance Cvro of the second capacitance element 139 on the outer circumferential side. Thereby, at both the inner circumferential side and the outer circumferential side of the edge ring 23, it is possible to sufficiently perform the compensation of the electric field fluctuation of the edge ring 23 caused by the consumption of the edge ring 23; and the uniformity in the surface of the etching characteristics improves remarkably.

In the support table 21 of the specific examples of the embodiment, the capacitance control of each capacitance element of the variable condenser 13 is not limited to the relationship described above; and it is sufficient for the control voltage of the first capacitance element 138 and the second capacitance element 139 to be adjusted according to the configuration of the edge ring 23 upper surface that is consumed. For example, if the recessed amount of the edge ring 23 on the outer circumferential side is larger than that on the inner circumferential side which is the reverse of FIG. 10B, the control may be performed so that the capacitance Cvro of the second capacitance element 139 on the outer circumferential side is large compared to the capacitance Cvri of the first capacitance element 138 on the inner circumferential side. Also, a third capacitance element may be disposed between the first capacitance element 138 on the inner circumferential side and the second capacitance element 139 on the outer circumferential side; separate control voltages may be supplied respectively to the capacitance elements; and by disposing the three or more capacitance elements along the diametrical direction of the wafer 100 on the outer side of the circumferential edge portion of the wafer 100, electric field control having even higher precision may be performed.

Here, to adjust the control voltage supplied to each capacitance element, the value and the modification timing of the control voltage may be determined based on the actual shape deformation of the edge ring 23 upper surface. For example, it is sufficient to mount an optical monitoring device that can sense the configuration of the edge ring 23 upper surface in the plasma processing apparatus 10 and to perform the control so that the control voltage supplied to each capacitance element is adjusted according to the shape deformation of the upper surface of the edge ring 23 that is sensed when using in the plasma processing apparatus 10. Or, the change of the etching characteristics of the wafer 100 occurring as the edge ring 23 is consumed may be observed;

and the adjustment value and the modification timing of the control voltage may be estimated to compensate the change of the etching characteristics.

For example, processing is implemented in which etching of the wafer 100 for process monitoring as the processing object is performed on the support table 21 according to the embodiment and the patterned configuration after the etching is measured. Here, processing such as that described above is repeatedly implemented in a state in which the control voltage value supplied to each capacitance element is modified and a standard value, an upper limit, and a lower limit are set in a stage directly after the edge ring 23 replacement and before the edge ring 23 is consumed. Thus, first, the relationship between the control voltage supplied to each capacitance element and the patterned configuration after the etching obtained according to the values of the control voltages, and in particular, the tilt with respect to the perpendicular direction of the patterned configuration at the wafer 100 circumferential edge portion, can be ascertained. More specifically, for example, the relationship between the control voltage value and the tilt angle of the patterned configuration at the wafer 100 circumferential edge portion is made as a calibration graph for each capacitance element.

Then, for example, processing such as that described above is multiply implemented in a state in which the control voltage values are set to the standard value until the standard replacement timing of the edge ring 23 is reached. Subsequently, the calibration graph that has been made as described above based on the patterned configuration of the wafer 100 measured for each of the multiple processing are used; and the control voltage values to be supplied to each capacitance element each time are calculated. Thus, information of the correlation between the control voltage values and the number of processing of the wafer 100 after the edge ring 23 replacement may be acquired and retained in the plasma processing apparatus 10; and the control voltage that is supplied to each capacitance element may be adjusted using the information. Here, a method is described in which the control voltage value supplied to the capacitance element is calculated by the control voltage value and the patterned configuration after the etching being linear. On the other hand, even in the case where the two do not have a linear relationship, a control voltage value corresponding to the number of processing of the wafer 100 can be calculated similarly by setting any control voltage value in addition to the standard value, the upper limit, and the lower limit and by making a calibration curve such that the precision is higher by increasing the number of times the processing is repeated as described above.

Figure 8A:
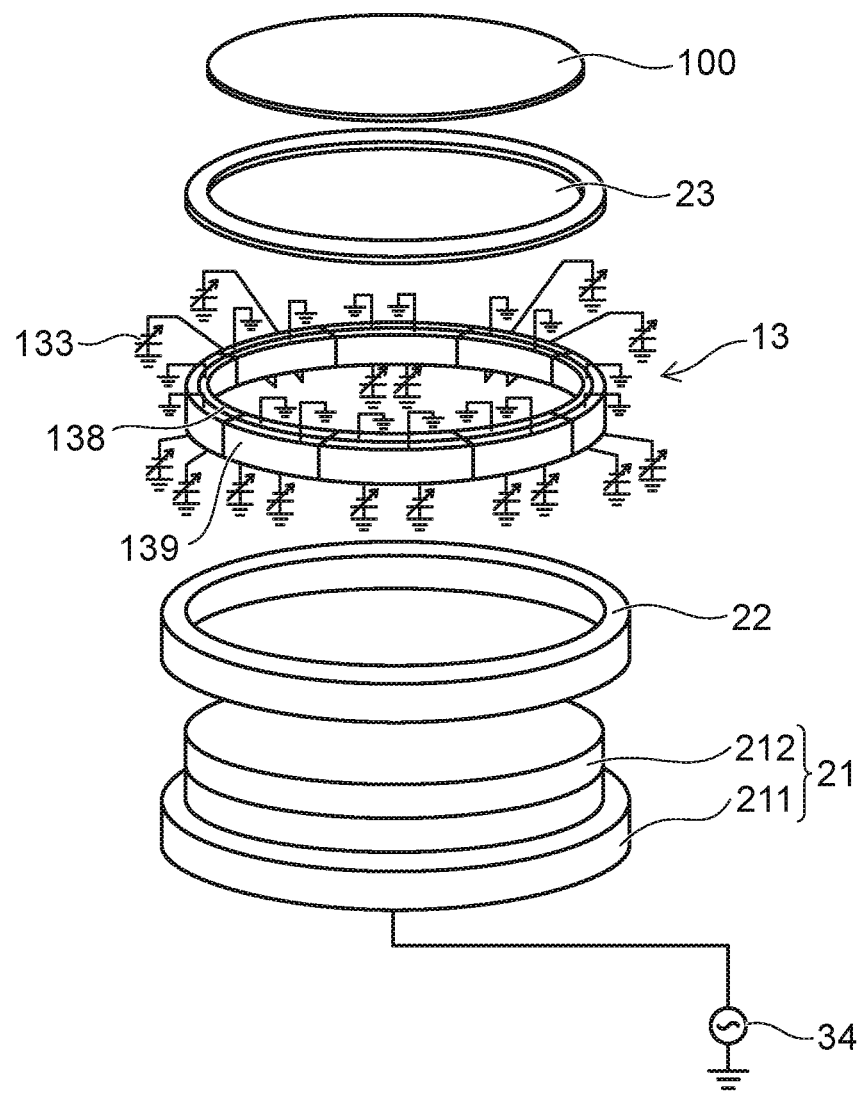
FIGS. 8A and 8B are drawings for describing a processing object support platform according to another embodiment.
Figure 8B:
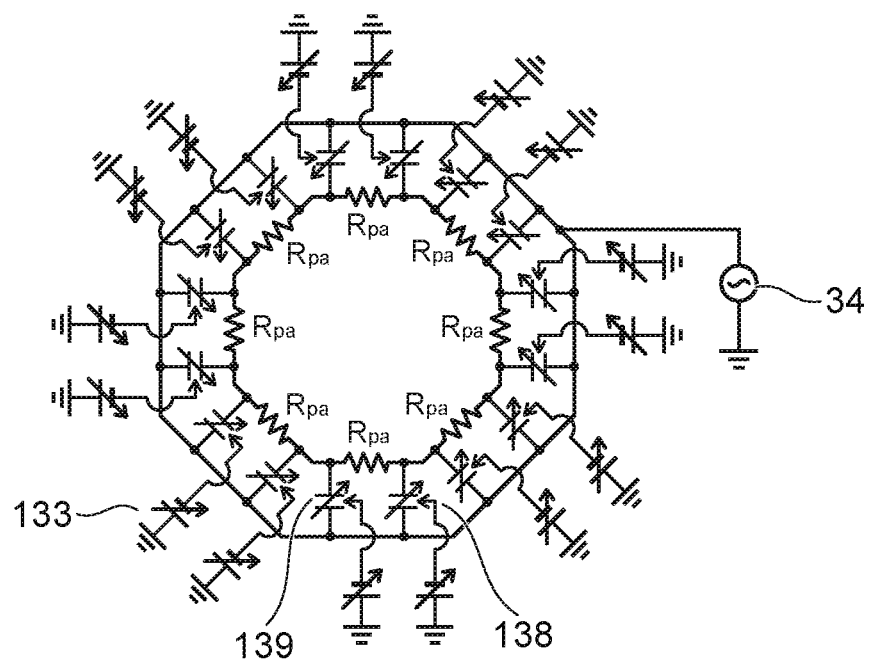

Another processing object support platform according to the embodiment of the invention will now be described with reference to FIGS. 8A and 8B. FIGS. 8A and 8B are drawings for describing the other processing object support platform according to the embodiment; FIG. 8A is a perspective view schematically showing the disassembled constituents of the processing object support platform and the periphery of the processing object support platform; and FIG. 8B is an equivalent circuit diagram. Here, in the support table 21, the first capacitance element 138 on the inner circumferential side and the second capacitance element 139 on the outer circumferential side such as those shown in FIG. 5B are disposed in the region having the circular ring configuration directly under the edge ring 23 and singulated along the circumferential direction of the support table 21; and similarly to the case of the circuit configuration shown in FIG. 4C, individual power supplies 133 that respectively correspond to the singulated first capacitance element 138 and second capacitance element 139 is provided. In FIG. 8A, the counter electrodes 131 shown in FIG. 5B are not illustrated for easier viewing of the drawing.

Thus, the set of the singulated first capacitance element 138 and second capacitance element 139 is multiply arranged along the circumferential direction of the support table 21; and by supplying the control voltages having mutually-different values to the capacitance elements, local electric field adjustment along the circumferential edge portion vicinity of the wafer 100 can be performed in the support table 21 shown in FIGS. 8A and 8B. Accordingly, it is possible to individually compensate the electric field fluctuation of the edge ring 23 that may be caused by the consumption of the edge ring 23, etc., not only on the inner circumferential side and the outer circumferential side of the edge ring 23 but also along the circumferential direction; and the uniformity in the surface of the etching characteristics further improves remarkably.

Even in the case where the variable condenser 13 having a structure such as that shown in FIG. 6B in which the first capacitance element 138 on the inner circumferential side and the second capacitance element 139 on the outer circumferential side are singulated along the circumferential direction of the support table 21 is used and a circuit configuration is used that can supply the control voltages having individual values respectively to the capacitance elements, it goes without saying that the uniformity in the surface of the etching characteristics similarly improve remarkably. The control voltage from a common power supply 133 may be supplied to the capacitance elements arranged along the circumferential direction of the support table 21 without providing the same number of power supplies 133 supplying the control voltages as the capacitance elements. For example, as described above, the region having the circular ring configuration directly under the edge ring 23 may be divided into multiple zones along the circumferential direction of the edge ring 23; and zone control of the electric field of the circumferential edge portion vicinity of the wafer 100 may be performed by supplying the control voltage from the same power supply 133 to the capacitance elements disposed inside the same zone for the first capacitance element 138 and the second capacitance element 139.

In a plasma processing method according to the embodiment using the plasma processing apparatus 10 such as that recited above, for example, the etching processing is performed as follows. First, the edge ring 23 is placed on the variable condenser 13 and the insulator ring 22; further, the wafer 100 which is the processing object is placed on the support table 21 and on the inner circumferential side end portion of the edge ring 23; and the wafer 100 is fixed by the upper plate 212 which is used as an electrostatic chuck mechanism. Then, the interior of the chamber 11 is evacuated to be a vacuum by a not-illustrated vacuum pump connected to the gas exhaust port 14. At this time, because the gas exhaust chamber 63 and the plasma processing chamber 61 are connected to each other by the gas exhaust holes 25 provided in the baffle plate 24, the entire interior of the chamber 11 is evacuated to be a vacuum by the vacuum pump linked to the gas exhaust port 14.

Subsequently, when the interior of the chamber 11 reaches a prescribed pressure, a processing gas is supplied from a not-illustrated gas supply apparatus to the gas supply chamber 62. The processing gas is supplied to the plasma processing chamber 61 from the gas supply chamber 62 via the gas flow channels 431 of the back plate 43 and the gas flow channels 445 of the upper electrode 44 of the shower head 41. When the pressure inside the plasma processing chamber 61 reaches a prescribed pressure, electrical power from the high frequency power supply 34 is supplied to the lower plate 211 (the lower electrode) of the support table 21 in a state in which the shower head 41 (the upper electrode 44) is grounded; and the plasma 110 is generated in the space above the wafer 100 and the edge ring 23 in the plasma processing chamber 61 between the support table 21 and the shower head 41. At this time, a potential gradient occurs between the plasma 110 and the wafer 100 on the lower electrode side due to a self-bias based on the high frequency voltage; and anisotropic etching is performed by the ions inside the plasma 110 being accelerated toward the support table 21.

Here, for example, directly after the apparatus maintenance of the plasma processing apparatus 10 is performed and the edge ring 23 on the support table 21 is replaced with an unused part, the upper surface of the wafer 100 and the upper surface of the edge ring 23 form a substantially flat surface when the wafer 100 (a first processing object) is placed on the upper plate 212 of the support table 21 as shown in FIGS. 2A and 2B or FIG. 5A and FIG. 6A. Subsequently, when the high frequency voltage for the plasma generation is applied to the lower plate 211 (the lower electrode) of the support table 21, the plasma 110 is generated inside the plasma processing chamber 61 so that the equipotential surface (the sheath interface) of the sheath edge of the plasma 110 spreads substantially horizontally from the top of the wafer 100 to the top of the edge ring 23. At this time, if the capacitance value of the variable condenser 13 is set to a first value Cvr1 in the equivalent circuit shown in FIG. 2C, the relationship expressed in the following Formula 1 roughly holds.

$$Csw+Ces=Cse+Ce+Cvr1 \qquad \text{Formula 1}$$

In this state, the ions inside the plasma 110 are incident along the orientation of the line of electric force extending in the perpendicular direction with respect to the wafer 100 surface even at the circumferential edge portion of the wafer 100; and the etching progresses substantially in the perpendicular direction for the entire surface of the wafer 100 which is the first processing object. Thus, after forming the desired holes or trenches in the wafer 100 which is the first processing object, similar etching processing may be further implemented continuously for the multiple wafers 100 (the first processing objects). When the etching processing of the wafer 100 is performed continuously, the processing conditions other than the control voltage supplied to the variable condenser 13 may be modified.

On the other hand, in the etching processing of the wafer 100 which is the first processing object, the edge ring 23 is consumed gradually because the ions inside the plasma 110 also collide with the edge ring 23. As a result, the upper surface of the edge ring 23 recedes or deforms to a configuration such as that shown in FIGS. 10A and 10B described above; and this causes a disturbance of the electric field at the circumferential edge portion of the wafer 100.

Continuing, in the plasma processing method according to the embodiment, a subsequent wafer 100 (a second processing object) is placed on the upper plate 212 of the support table 21 while the edge ring 23 having the changed configuration compared to when the etching processing of the previous wafer 100 (the first processing object) was performed is still placed on the variable condenser 13; and etching processing of the wafer 100 which is the second processing object is performed. At this time, to cancel the disturbance of the electric field at the circumferential edge portion of the wafer 100 (the second processing object), the electric field of the circumferential edge portion of the wafer 100 is adjusted by modifying the value of the control voltage supplied to the variable condenser 13 directly under the edge ring 23 and setting the capacitance value of the variable condenser 13 to a value that is different from the first value Cvr1 in the etching processing of the previous wafer 100 (the first processing object).

Here, the relationship expressed by the following Formula 2 roughly holds for the equivalent circuit shown in FIG. 2C, where a second value Cvr2 is a capacitance value that is different from Cvr1 recited above set to the variable condenser 13.

$$Csw+Ces=C'se+C'e+Cvr2 \qquad \text{Formula 2}$$

In Formula 2, $C'se$ is the capacitance of the sheath in the state in which the upper surface of the edge ring 23 is recessed; and because the sheath thickness is thick compared to the initial state of the edge ring 23, the capacitance value is small compared to Cse in Formula 1 recited above (Cse>C'se). On the other hand, $C'e$ in Formula 2 is the capacitance of the edge ring 23 having the recessed upper surface; but because the thickness is thin compared to the initial state, the capacitance value is slightly larger compared to Ce in Formula 1 recited above (Ce<C'e). However, normally, because the effects of the capacitance change of the sheath are large due to the sheath thickness being thicker, C'se+C'e in Formula 2 has the tendency of the capacitance value becoming small compared to Cse+Ce in Formula 1. Accordingly, when the left sides of Formula 1 and Formula 2 are not changed, the electric field fluctuation at the circumferential edge portion of the wafer 100 due to the shape deformation of the consumed edge ring 23 can be compensated by setting the second value Cvr2 to a desired value that is larger than the first value Cvr1. Thus, in the plasma processing method according to the embodiment, by setting the capacitance value of the variable condenser 13 directly under the edge ring 23 having the recessed upper surface to be larger, the ions inside the plasma 110 are incident along the orientation of the line of electric force extending in the perpendicular direction with respect to the wafer 100 surface even at the circumferential edge portion of the wafer 100; therefore, the etching progresses in a substantially perpendicular direction for the entire surface of the wafer 100 which is the second processing object; and even the uniformity in the surface of the etching characteristics improves.

In particular, in the case where the support table 21 according to the specific examples of the embodiment shown in FIGS. 5A to 6B is used, for Cvri and Cvro in the equivalent circuit shown in FIG. 7, the improvement of the uniformity in the surface of the etching characteristics can be exceeding by setting the capacitance value in the etching processing of the wafer 100 which is the second processing object to be large compared to the etching processing of the wafer 100 which is the first processing object. At this time, it is sufficient to appropriately determine the adjustment ranges of Cvri and Cvro when processing the first processing object and when processing the second processing object according to the degree of deformation of the edge ring 23 upper surface. For example, as shown in FIGS. 8A and 8B, even in the case where the control voltages having mutually-different values are supplied to the multiple variable condensers 13 arranged along the circumferential direction of the support table 21, the values of the control voltages having mutually-different values may be set dynamically while appropriately determining the adjustment ranges of the capacitance values of the variable condensers 13 to which the control voltages are supplied so that the capacitance value is large in the processing of the second processing object compared to the processing of the first processing object. The plasma processing method according to the embodiment is not limited to the example in which the capacitance value of the variable condenser 13 is adjusted/set in two stages in the processing of the first processing object and in the processing of the second processing object; and the capacitance value of the variable condenser 13 may be adjusted/set in three or more stages according to the consumption of the edge ring 23.

An example is described above in which a parallel plate-type RIE apparatus is used as the plasma processing apparatus 10. However, an ICP (Inductively Coupled Plasma) or ECR (Electron Cyclotron Resonance) RIE apparatus, a general processing apparatus other than an RIE apparatus such as an asking apparatus, a CDE (Chemical Dry Etching) apparatus, a CVD (Chemical Vapor Deposition) apparatus, etc., or a general semiconductor manufacturing apparatus is applicable to the embodiments described above.

Figure 9:
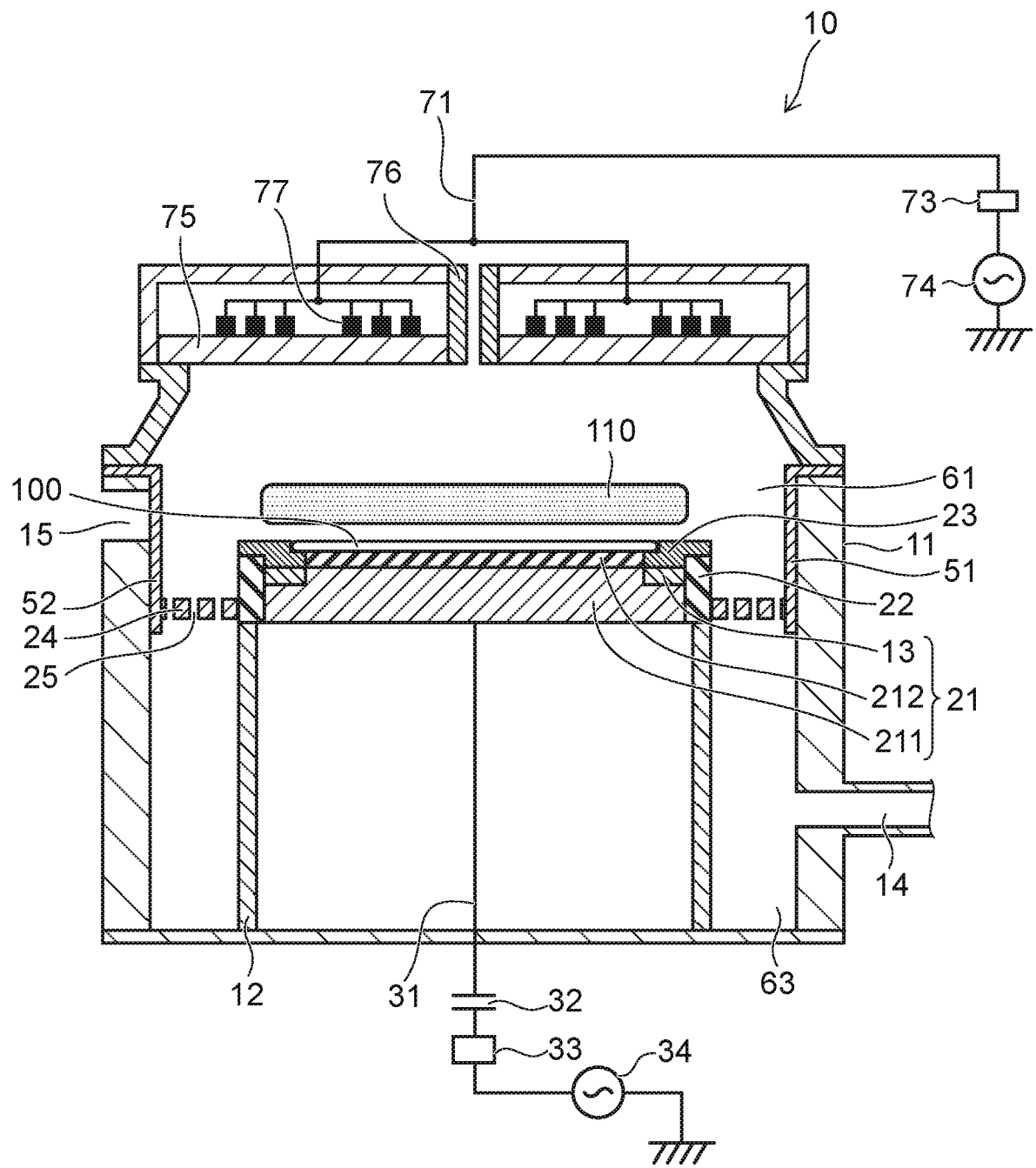
FIG. 9 is a cross-sectional view schematically showing another example of the configuration of the plasma processing apparatus according to the embodiment.

In FIG. 9, the cross section of an ICP type RIE apparatus is schematically shown as another configuration example of the plasma processing apparatus according to the embodiment of the invention. Below the processing object support platform, the plasma processing apparatus 10 shown in FIG. 9 has a structure similar to that shown in FIG. 1; the same constituents as those of FIG. 1 are marked with the same reference numerals; and a description thereof is omitted as appropriate.

The interior of the plasma processing apparatus 10 can be divided into the plasma processing chamber 61 and the gas exhaust chamber 63. The plasma processing chamber 61 is a region partitioned by a top plate 75 of the chamber 11 and the support table 21 and the baffle plate 24 inside the chamber 11. The gas exhaust chamber 63 is the region of the lower portion inside the chamber 11 partitioned by the supporter 12 and the baffle plate 24.

In the plasma processing chamber 61, the top plate 75 opposes the support table 21; and the upper surface of the support table 21 and the lower surface of the top plate 75 are provided to be separated from each other by a prescribed distance. Alumina, etc., that transmit high frequency waves with low loss may be used as the material of the top plate 75. A gas nozzle 76 as a gas supply unit is provided in the central portion vicinity of the top plate 75 to be arranged to oppose the support table 21; and a not-illustrated gas supply apparatus is connected to the gas nozzle 76 via a pipe. The gas supply apparatus introduces the processing gas into the chamber 11 via the gas nozzle 76 in the plasma processing.

A high frequency coil 77 is included at the upper portion of the top plate 75. A power supply line 71 that supplies high frequency power is connected to the high frequency coil 77; and a matching unit 73 and a high frequency power supply 74 are connected to the power supply line 71. By applying the high frequency power to the high frequency coil 77 from the high frequency power supply 74, the processing gas that is introduced to the chamber 11 from the gas nozzle 76 is plasmatized; and the plasma 110 is generated in the space above the wafer 100 and the edge ring 23 in the plasma processing chamber 61. On the other hand, the high frequency power supply 34 that is connected to the lower plate 211 of the support table 21 generates a bias by supplying electrical power to the lower plate 211 in the plasma processing and is used to attract the ions inside the plasma 110 to the wafer 100 surface.

Here as well, the edge ring 23 is provided at the outer circumference above the support table 21 so that the electric field based on the high frequency power supply 34 is not deflected with respect to the perpendicular direction at the circumferential edge portion of the wafer 100. The variable condensers 13 such as those shown in FIGS. 4A to 8B are arranged uniformly along the circumferential direction of the support table 21 in the region having the circular ring configuration directly under the edge ring 23. Accordingly, in the plasma processing apparatus 10 shown in FIG. 9 as well, by adjusting the values of the control voltages supplied to the variable condensers 13, the electric field fluctuation at the circumferential edge portion of the wafer 100 due to the shape deformation of the edge ring 23, etc., is compensated; and it is possible to suppress the degradation of the uniformity in the surface of the etching characteristics.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A plasma processing-apparatus processing object support platform, comprising:
   a lower plate, the lower plate being electrically conductive;
   an upper plate provided on the lower plate, a processing object being placed on an upper surface of the upper plate; and
   a variable condenser provided along a circumferential direction of the lower plate in a region at an upper outer circumferential vicinity of the lower plate below an edge ring, the region having an annular configuration, the variable condenser including a plurality of first capacitance elements disposed on an inner circumferential side in the region having the annular configuration, and a plurality of second capacitance elements disposed on an outer circumferential side in the region having the annular configuration, a plurality of sets of one of the first capacitance elements and one of the second capacitance elements being multiply arranged along the circumferential direction, mutually-different control voltages being suppliable to the plurality of sets of the one of the first capacitance elements and the one of the second capacitance elements, the sets being arranged along the circumferential direction,
   wherein the first and second capacitance elements each comprise a pair of counter electrodes and a variable capacitance is held between the pair of counter electrodes.

2. The support platform according to claim 1, wherein
   a variable capacitance unit is arranged held between the pair of counter electrodes, and
   wherein the variable condenser is disposed to have an orientation in which one of the pair of counter electrodes is on a lower side and the other of the pair of counter electrodes is on an upper side.

3. The support platform according to claim 2, wherein the control voltage is supplied between the pair of counter electrodes.

4. The support platform according to claim 2, wherein each of the first and second capacitance elements further includes a pair of control electrodes provided at positions not interfering with the pair of counter electrodes.

5. The support platform according to claim 4, wherein
a prescribed bias voltage is supplied between the pair of counter electrodes, and
the control voltage is supplied between the pair of control electrodes.

6. The support platform according to claim 2, wherein the variable capacitance unit is a p-n junction-type diode.

7. The support platform according to claim 2, wherein the variable capacitance unit is a ferroelectric.

8. The support platform according to claim 1, wherein
the lower plate includes an upper portion, a lower portion, and a stepped portion between the upper portion and the lower portion, the upper portion being positioned on the upper plate side and having substantially a same outer diameter as the upper plate, the lower portion having a larger outer diameter than the upper portion, and
the variable condenser is disposed at the stepped portion of the lower plate.

9. A plasma processing apparatus, comprising:
the plasma processing-apparatus processing object support platform according to claim 1;
a gas supply unit arranged to oppose the processing object support platform;
a chamber housing the processing object support platform and the gas supply unit; and
a RF power supply supplying electrical power to the lower plate of the processing object support platform.

\* \* \* \* \*